United States Patent [19]

Cain, Jr. et al.

[11] 4,157,501
[45] Jun. 5, 1979

[54] DIGITAL PANEL METER

[75] Inventors: Ralph E. Cain, Jr., Mansfield; Thomas J. Crowell, Dedham, both of Mass.

[73] Assignee: R. T. Engineering Service Inc., Mansfield, Mass.

[21] Appl. No.: 871,202

[22] Filed: Jan. 23, 1978

[51] Int. Cl.² .................... G01R 15/12; G01R 19/22; G01R 1/30

[52] U.S. Cl. ................................. 324/115; 324/119; 324/123 R; 324/156

[58] Field of Search .................. 324/115, 119, 123 R, 324/110, 74, 130, 156

[56] References Cited

U.S. PATENT DOCUMENTS

| 3,183,446 | 5/1965 | Richman | 324/110 |
|---|---|---|---|
| 4,037,154 | 7/1977 | Chamran et al. | 324/74 |

OTHER PUBLICATIONS

Thompson, L.; "A New Five-Digit Multimeter"; Hewlett-Packard J.; vol. 23; No. 12; Aug. 1972; pp. 7-12.

*Primary Examiner*—Rudolph V. Rolinec
*Assistant Examiner*—Ernest F. Karlsen
*Attorney, Agent, or Firm*—Wolf, Greenfield & Sacks

[57] ABSTRACT

The meter is primarily adapted to replace a standard analog panel meter and is designed to selectively receive different ranges of input signals such as DC input signals in ranges extending from 50 mVDC to 500 VDC. In the disclosed embodiment there are four ranges also adapted to receive AC input signals in ranges extending from 100 mVAC to 480 VAC. Preferably, a jumper is used to select the different ranges. The jumper is readily accessible at the rear of the meter. The meter circuitry comprises an analog to digital converter having three digit, seven segment display and input circuitry including a range circuit, an operational amplifier and filter circuitry coupling serially to the converter.

11 Claims, 4 Drawing Figures

DIGITAL PANEL METER

BACKGROUND OF THE INVENTION

The present invention relates in general to meters and is concerned, more particularly, with a digital panel meter that is primarily adapted as a replacement meter for a standard analog panel meter. The meter of this invention is primarily adapted for replacement of the standard 4½ inch analog meter presently in use.

There are certain disadvantages associated with analog panel meters. For example, with analog meters there is a problem of the sticking of the pointer. Furthermore, analog panel meters have parallax problems and have reading errors. Accordingly, one object of the present invention is to eliminate these prior problems that are common to analog panel meters by providing a digital panel meter that can be at least 6 times as accurate as the analog meter and that can be easily read with little or no ambiguity in the reading.

Another object of the present invention is to provide an improved digital panel meter that has universal range adjustment and accepts both DC and AC input signals.

A further object of the present invention is to provide a digital panel meter than is very easy to install and calibrate even by a non-technical person.

Still another object of the present invention is to provide a meter having improved accuracy of, for example, 0.5% of the full scale ± one digit.

Still a further object of the present invention is to provide a digital panel meter that is relatively compact and that provides for the easy change from one range of operation to another.

Another object of the present invention is to provide a digital panel meter that has a range scale adjustment and that also has the capability of use of the decimal point.

Still a further object of the present invention is to provide a digital panel meter that may be used in many different process applications including applications for reading in revolutions per minute, feet per minute, meters per minute, strokes per minute, bags per minute, pounds, gallons, amperes (DC or AC), volts (DC or AC) and percent load.

SUMMARY OF THE INVENTION

To accomplish the foregoing and other objects of this invention, there is provided a digital panel meter which comprises a housing for mounting the majority of the components comprising the meter circuitry. Preferably, a terminal strip is mounted from the rear of the housing including input terminal means for receiving either AC or DC input signals. The circuitry of the panel of this invention includes a range circuit means that preferably has a jumper for selecting one of a plurality of different amplitude ranges. The jumper is easily accessible at the rear of the meter with the jumper being connectable between different terminals on the terminal strip. Another connection to the terminal strip is an input AC power connection which couples to a power supply for the meter which provides a regulated output voltage and also unregulated voltages for the meter circuitry. The meter circuitry also comprises amplifier means, rectifier means, filter means and an analog to digital converter means. the amplifier means is preferably an operational amplifier having an input coupling from the range circuitry and having its output coupled to a rectifier means which may comprise in part a diode and associated current limiting resistor. The rectifier passes signals of only one polarity while substantially blocking signals of the opposite polarity. The rectifier means in the disclosed embodiment comprises a half-wave rectifier circuit. At the output of the rectifier means there is a filter means for smoothing out the rectified waveform. The signal from the filter means couples to the converter which is preferably a conventional device employing a built-in display which may be a three digit, seven segment display viewed through the housing for supporting the display.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

Figure 1:
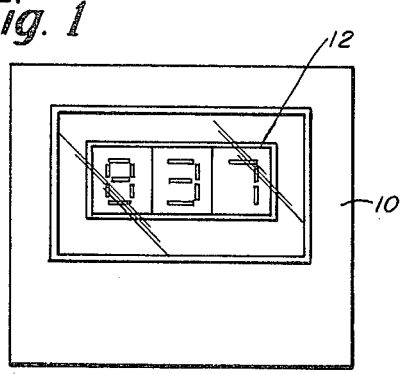
FIG. 1 is a front view of the digital panel meter of this invention.
Figure 2:
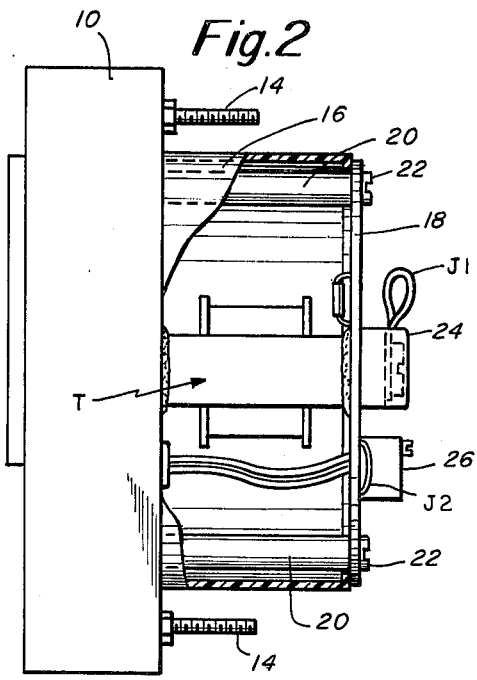
FIG. 2 is a side elevation view of the meter of FIG. 1 partially cut away.
Figure 3:
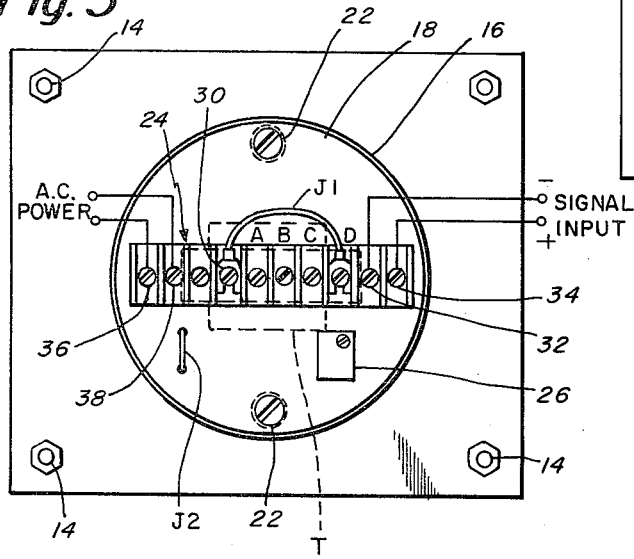
FIG. 3 is a rear elevation view of the meter shown in FIGS. 1 and 2.
Figure 4:
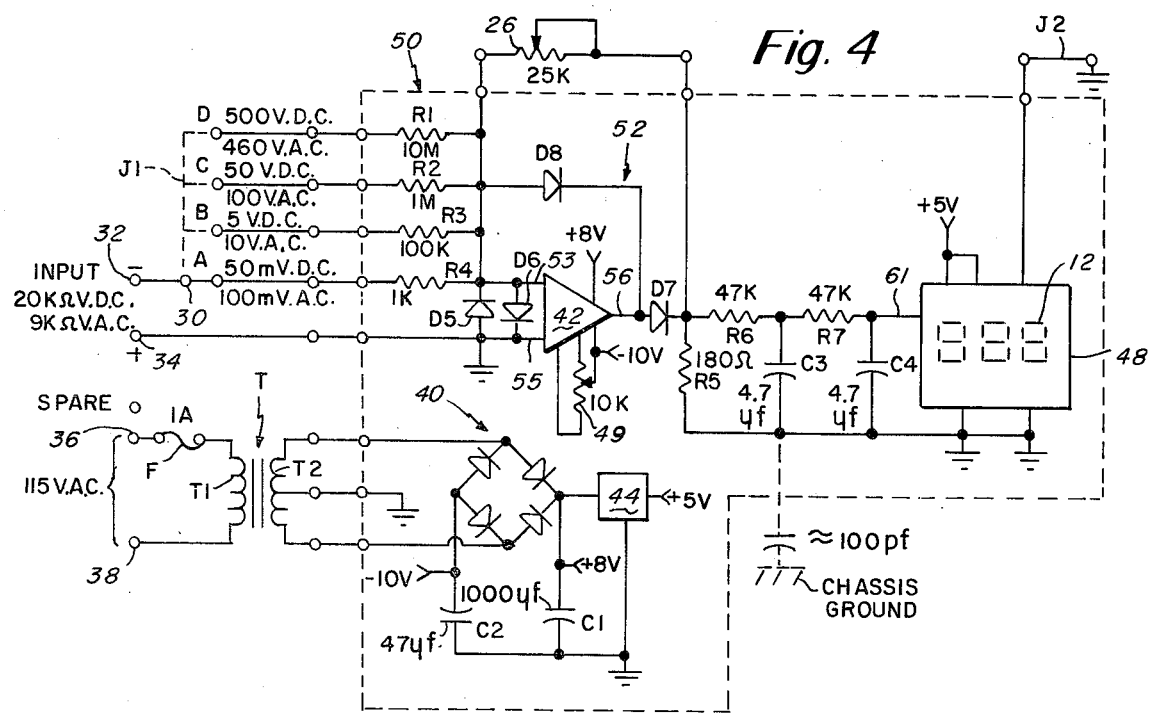
FIG. 4 is a schematic circuit diagram of the meter circuitry of this invention.

FIGS. 1–3 show the general outer construction of the meter of this invention. FIG. 4 is a schematic diagram of the meter circuitry.

The meter comprises a housing 10 which may be constructed of either steel or a plastic material and which may be provided in two separable parts. In the front view of FIG. 1 there is shown the display 12 which is a three digit display viewable at the front of the housing 10. The housing 10 may also have therein a printed circuit board or the like for mounting electronic components such as at least some of the components shown in FIG. 4.

The meter of this invention may be inserted in a panel such as an instrument control panel and for the purpose of mounting the meter there is provided a series of mounting screws 14 at each corner of the housing 10 as depicted in FIGS. 2 and 3.

Some of the electric components are not mounted in the housing 10 but are instead mounted within the cover 16 which is shown partially cut away in FIG. 2. The cover 16 is open at both ends and has a ridge fitting under the mounting plate 18. The mounting plate 18 is supported from the housing 10 by means of a pair of support posts 20 having associated screws 22 for securing the plate 18 to the posts 20 with the cover 16 at the same time being held in position. One of the components mounted within the cover 16 is a transformer T which may be fixedly secured between the housing 10 and the mounting plate 18. The mounting plate 18 is primarily for supporting the terminal strip 24 depicted in FIGS. 2 and 3. In addition, the plate 18 also supports a potentiometer 26 discussed in detail hereinafter.

The panel meter of this invention is a versatile instrument and is designed to fit in the same mounting cutouts as a standard 4½ inch analog meter, yet it will accept a wide variety of input signal devices and voltage ranges. The unit can be readily calibrated with the use of a 20 turn potentiometer mounted on the rear of the meter and shown as potentiometer 26 in the drawings. The unit can read out any three digit parameter required from 00.0 to 99.9 or 000 to 999. The meter preferably has four input voltage ranges within which it can handle input signal levels of 50 mVDC/100 mVAC to 500 VDC/480 VAC. In FIGS. 3 and 4 the voltage ranges include range A 50 mVDC; 100 mVAC, range B 5 VDC; 10 VAC, range C 50 VDC; 100 VAC, and range D 500 VDC; 480 VAC.

The meter of this invention has an accuracy of 0.5% of full scale ±1 digit. The input resistance is 20,000 ohms per volt DC and 9,000 ohms per volt AC. The preferred maximum signal frequency is 2,000 Hz. The input power is the conventional 115 VAC voltage, 60 Hz, 2 watts. The preferred operating temperature range is 5° C. to 50° C.

FIGS. 3 and 4 show the jumper J1 which is fixed at one end to the terminal 30 and is selectively coupled to any one of the other range terminals A, B, C or D. The input signal is coupled to terminals 32 and 34 and in the case of a DC input signal the proper polarity, as shown, is to be observed in connecting the signal source. The AC input power for the power supply of this invention is coupled to the terminals 36 and 38.

With particular reference to FIG. 4, the power supply circuit receives the conventional input AC voltage at terminals 36 and 38 and couples this voltage by way of fuse F to the primary winding T1 of transformer T. The secondary winding T2 of the transformer has a grounded center tap and has its other two connections coupling to a full wave rectifier bridge 40. There are a pair of capacitors C1 and C2 associated with the output of the bridge circuit 40. The voltage across these capacitors is an unregulated voltage that may be used, for example, for the operational amplifier 42. The output of the bridge circuit 40 also couples to regulator 44 which may be a conventional regulator such as an MC7805, three terminal regulator supplying 5 volts ±0.2 VDC. This is a regulated voltage that is used with the converter device 48 which preferably is an AD2026 device sold by Analog Devices including a display 12. The power dissipated by the regulator is preferably 0.8 watts maximum which is 35% below rating at 125 VAC power input and 40° C. ambient. There is a ripple on the unregulated voltage which may be 2.4 volts peak-to-peak. However, this ripple causes at worst a ⅓ digit in accuracy. With the power supply the line power consumption is at a maximum of two watts. The typical transformer secondary output is 120 ma (RMS) per winding. The total mean DC current into the regulator is approximately 120 ma when all of the LED segments of the display 12 are illuminated. The fuse F is for transformer short-circuit protection.

The analog input section of the meter circuitry comprises a scaling (range) network 50 and a variable gain half-wave rectifier circuit 52. The inputs at the terminals 32 and 34 may be either AC or DC or a constant area pulse train with ranges as previously indicated. The input impedances for each range are represented by the resistors R1–R4 of respective values 10 megohm, 1 megohm, 100 kohm and 1 kohm. Of course, only one of the resistors R1–R4 are selected at a time by means of the jumper J1, to couple the input signal to the input 53 of the operational amplifier 42.

The operational amplifier 42 is preferably a conventional operational amplifier preferably a type 741 having an offset null controlled by potentiometer 49, a pair of input terminals 53 and 55, and an output terminal 56. One of the important features of the present invention is the use of the oppositely arranged diodes D5 and D6 which limit the voltage difference at the input terminals of the amplifier, both in a positive and a negative sense. The diode D8 which is coupled across the operational amplifier 42 is for preventing excessive slew times and AC non-linearities by limiting the negative output of the amplifier 42 to about −0.6 volts which occurs during the negative half cycles when considering AC operation. In the DC reading mode the maximum gains are 25, 0.25, 0.025, and 0.0025, respectively for the gains A–D. For symmetrical AC waveforms, the DC gain is multiplied by $\frac{1}{2} \times$ (mean-absolute-value) = $(\frac{1}{2}) \times (0.900) \times (V_{rms})$ for sinusoids. The margin of gain adjustment is sufficiently large so that all ranges produce a full scale readout. However, the 1000 VAC scale is derated to 480 VAC maximum for dielectric reasons. Constant area pulse frequency may be read as an average voltage. In the pulse reading mode slew limitations appear as a constant multiplier. In the AC mode, input frequency must be limited to frequency of approximately 3.5 KHz.

Thus, for AC or pulsed modes of operation the output at the cathode of diode D7 is a half-wave rectified signal having the usual sinusoidal positive portion of the signal and a clipped negative portion which is clipped at approximately 0.6 volts. Thus, the operational amplifier 42 actually forms an inversion with any negative signals at its input 53 appearing as a positive voltage level at the output 56 of the amplifier.

The output from the rectifier which comprises diode D7 couples to a filter circuit which is preferably a compound lag filter comprised of resistors R6 and R7 along with capacitors C3 and C4 connected as a ladder network. The roll off of this filter is approximately 40 dB/decade above 0.7 Hz. For AC tachometer inputs a multi-pole tachometer such as one having 28 poles is recommended in order to insure that the ripple content after the filter is less than the resolution of the meter over the entire range. A lower number of poles may be used but useful range on the lower end may be limited. For DC inputs an approximately 0.9 second lumped time constant is present. The settling time to 0.1% (1 digit) is approximately 6 seconds. The filter network tends to provide an output into the converter 48 which is a signal that essentially follows the peaks of the waveform in AC applications.

The potentiometer 26 controls the gain of the operational amplifier and is adjustable during the calibration of the meter so that with a standard signal source the digital reading can be calibrated by the use of the potentiometer 26 to the correct value. The potentiometer 49 is an offset adjustment which effects only the milivolt range where the input offset voltage could cause errors if not nulled.

The converter 48 is a conventional device constructed by Analog Devices and identified as their part No. AD2026. This device converts the analog voltage on the input line 61 to a digital reading which is displayed on the display 12.

What is claimed is:
1. A digital panel meter comprising;
   a housing,
   input terminal means for receiving AC and DC input signals,
   range circuit means including means responsive to the output of the input terminal means and means for selecting one of a plurality of different amplitude ranges,
   amplifier means responsive to the output of the range circuit means and having an output, rectifier means responsive to the output of the amplifier means for passing signals of only one polarity while substantially blocking signals of the opposite polarity, filter means responsive to the output of the rectifier means, analog to digital converter means responsive to the output of the filter means and including display means mounted in the housing, means for providing operating power for at least said amplifier means and converter means including a transformer and rectifier circuit, a mounting plate at the rear of the housing, means supporting the mounting plate from the rear of the housing to define a space between the housing and mounting plate, said transformer being disposed in said space, and a terminal strip also at the rear of the housing including terminals forming the input terminal means and AC power terminals.

2. A digital panel meter as set forth in claim 1 wherein said amplifier means includes an operational amplifier and said rectifier means includes a diode.

3. A digital panel meter as set forth in claim 2 wherein said range circuit means includes a plurality of different value scaling resistors each coupling to a signal input of the operational amplifier.

4. A digital panel meter as set forth in claim 3 wherein said means for selecting includes a jumper selectively coupled to only one of said scaling resistors.

5. A digital panel meter as set forth in claim 4 including a pair of oppositely poled diodes across the input of the operational amplifier.

6. A digital panel meter as set forth in claim 5 wherein said filter means includes a resistor-capacitor ladder network.

7. A digital panel meter as set forth in claim 6 including a scale potentiometer across the operational amplifier for calibration purposes of the display.

8. A digital panel meter as set forth in claim 7 wherein said power means includes a transformer, rectifier bridge and filter capacitor.

9. A digital panel meter as set forth in claim 1 includng a diode connected between the input and output of the amplifier means.

10. A digital panel meter as set forth in claim 1 wherein said means for supporting the mounting plate includes post means, and wherein said terminal strip is secured to said mounting plate.

11. A digital panel meter as set forth in claim 10 wherein said range circuit means includes a plurality of different value scaling resistors, said means for selecting including a jumper selectively coupled to one of said scaling resistors, said terminal strip including terminals for said jumper.

* * * * *